(12) United States Patent
Wang et al.

(10) Patent No.: US 10,553,817 B2
(45) Date of Patent: Feb. 4, 2020

(54) DISPLAY BACKPLANE AND MANUFACTURE METHOD THEREOF, DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Yanxin Wang, Beijing (CN); Song Wang, Beijing (CN); Shuquan Yang, Beijing (CN); Peng Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/994,352

(22) Filed: May 31, 2018

(65) Prior Publication Data

US 2019/0088902 A1 Mar. 21, 2019

(30) Foreign Application Priority Data

Sep. 19, 2017 (CN) .......................... 2017 1 0848446

(51) Int. Cl.
*H01L 51/00* (2006.01)
*H01L 51/52* (2006.01)
*H01L 27/32* (2006.01)
*H01L 51/56* (2006.01)

(52) U.S. Cl.
CPC ........ *H01L 51/5246* (2013.01); *H01L 27/323* (2013.01); *H01L 51/56* (2013.01); *H01L 51/0097* (2013.01)

(58) Field of Classification Search
CPC . H01L 51/5246; H01L 51/5253; H01L 51/56; H01L 51/0097; H01L 27/323
USPC ............................................................ 257/40
See application file for complete search history.

(56) References Cited

U.S. PATENT DOCUMENTS

2013/0169515 A1* 7/2013 Prushinskiy .......... G06F 1/1652
345/55
2015/0102298 A1* 4/2015 Namkung ........... H01L 51/0097
257/40
2017/0062760 A1* 3/2017 Kim .................... H01L 51/5253

FOREIGN PATENT DOCUMENTS

CN 105975135 A 9/2016

OTHER PUBLICATIONS

The First Chinese Office Action dated Jul. 2, 2019; Appln. No. 201710848446.3.

* cited by examiner

*Primary Examiner* — Tu-Tu V Ho
(74) *Attorney, Agent, or Firm* — Ladas & Parry LLP; Hermine Valizadeh

(57) ABSTRACT

A display backplane and a manufacture method thereof, a display device are disclosed. The display backplane includes a bending area and a non-bending area; the bending area includes an adhesive layer on a surface of the bending area that is stretched during the bending area being bent around a central axis of the bending area, and the adhesive layer includes a buffer structure for buffering bending stress of the bending area, and the buffer structure is at a position of the central axis of the bending area.

15 Claims, 5 Drawing Sheets

DISPLAY BACKPLANE AND MANUFACTURE METHOD THEREOF, DISPLAY DEVICE

CROSS-REFERENCE TO RELATED APPLICATION

The present application claims priority to the Chinese patent application No. 201710848446.3, filed on Sep. 19, 2017, the entire disclosure of which is incorporated herein by reference as part of the present application.

TECHNICAL FIELD

The embodiments of the present disclosure relate to a display backplane and a manufacture method thereof, a display device.

BACKGROUND

With the development of display technology, the screen of an electronic display product is developed towards to comprise a narrow frame or be without a frame, and an OLED (organic light emitting diode) display device is conducive to realize the design of narrow frame. At present, bending a flexible backplane is an important technical solution to narrow a lower frame of a display device, and the effect of narrowing the lower frame of an OLED display backplane is mainly achieved by bending the OLED display backplane.

At present, where a bending process is performed on the bending area of the OLED display backplane, and poor contact of the circuits is brought in the backplane during the bending process, and bending success ratio and product yield of the OLED display backplane is affected.

SUMMARY

An embodiment of the present disclosure provides a display backplane, comprising a bending area and a non-bending area, wherein the bending area comprises an adhesive layer on a surface of the bending area that is stretched during the bending area being bent around a central axis of the bending area, and the adhesive layer comprises a buffer structure for buffering bending stress of the bending area, and the buffer structure is at a position of the central axis of the bending area.

For example, in the display backplane provided by the embodiment of the present disclosure, a central axis of the buffer structure coincides with the central axis of the bending area.

For example, in the display backplane provided by the embodiment of the present disclosure, the buffer structure is a groove or a protrusion formed at the position of the central axis of the bending area on the adhesive layer.

For example, in the display backplane provided by the embodiment of the present disclosure, the buffer structure extends to two edges of the bending area.

For example, in the display backplane provided by the embodiment of the present disclosure, a cross-sectional shape of the buffer structure in a plane perpendicular to a direction of the central axis of the bending area is a V-shape, a circular arc shape or a U-shape.

For example, in the display backplane provided by the embodiment of the present disclosure, where the buffer structure is a groove, a depth of the groove is ⅓ to ⅔ of a thickness of the adhesive layer.

For example, in the display backplane provided by the embodiment of the present disclosure, where the buffer structure is a protrusion, a height of the protrusion is ⅓ to ⅔ of a thickness of the adhesive layer.

For example, in the display backplane provided by the embodiment of the present disclosure, the buffer structure comprises a plurality of grooves or protrusions symmetrically arranged in the adhesive layer with respect to the central axis of the bending area.

Another embodiment of the present disclosure provides a display device, comprising any one of the above display backplanes, wherein the bending area of the display backplane is bent around the central axis of the bending area.

For example, in the display device provided by the embodiment of the present disclosure, the non-bending area comprises a display area and a bonding area, and the display area and the bonding area are respectively on two sides of the bending area.

For example, in the display device provided by the embodiment of the present disclosure, the display device is an OLED display device.

Further another embodiment of the present disclosure provides a manufacture method of any one of the above display backplanes, comprising: forming the adhesive layer on the surface of the bending area that is stretched during the bending area being bent around the central axis of the bending area; and forming the buffer structure on the adhesive layer at the position of the central axis of the bending area.

For example, in the manufacture method provided by the embodiment of the present disclosure, a central axis of the buffer structure coincides with the central axis of the bending area.

For example, in the manufacture method provided by the embodiment of the present disclosure, the buffer structure is a groove or a protrusion formed at the position of the central axis of the bending area on the adhesive layer.

For example, in the manufacture method provided by the embodiment of the present disclosure, the forming of the buffer structure on the adhesive layer at the position of the central axis of the bending area comprises: scanning and coating an adhesive line by line in the bending area in a direction parallel to the central axis of the bending area; and performing at least one additional scanning and coating process to form the protrusion at the position of the central axis of the bending area; alternatively, performing at least one additional scanning and coating process in a remaining position of the bending area except for the position of the central axis of the bending area to form the groove.

For example, in the manufacture method provided by the embodiment of the present disclosure, the performing of at least one additional scanning and coating process to form the protrusion at the position of the central axis of the bending area comprises: performing a plurality of scanning and coating processes at the position of the central axis of the bending area, wherein a number of scanning and coating processes gradually decreases in a direction from the central axis of the bending area to an edge of the bending area.

For example, in the manufacture method provided by the embodiment of the present disclosure, the performing of at least one additional scanning and coating process in the remaining position of the bending area except for the position of the central axis of the bending area to form the groove comprises: performing a plurality of scanning and coating processes in the remaining position of the bending area except for the position of the central axis of the bending area, wherein a number of scanning and coating processes gradually increases in a direction from the central axis of the bending area to an edge of the bending area.

For example, the manufacture method provided by the embodiment of the present disclosure further comprises: bending the bending area around the central axis of the bending area.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
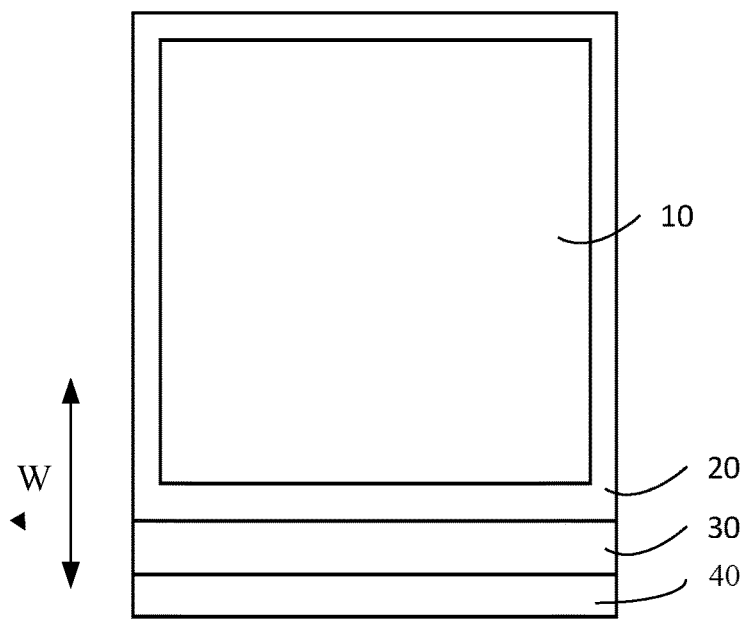
FIG. 1A is a plane structure schematic diagram of a display backplane provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "compris- ing," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, where a bending process is performed on the bending area of the OLED display backplane. The inventor found that large stress is generated during the bending area being bent, and a sharp corner is easily formed or an asymmetrical bending occurs in the bending area after the bending process, which results in stress concentration in metal lines in the bending area, and further results in the metal lines being broken or easy to be corroded, and therefore poor contact of the circuits is brought in the backplane, and bending success ratio and product yield of the OLED display backplane is affected.

An embodiment provides a display backplane, and the display backplane is, for example, a liquid crystal display backplane or an organic light emitting diode (OLED) display backplane. For example, the organic light emitting display backplane is a flexible display backplane. The display backplane comprises an array substrate, and other structures such as an opposite substrate can also be provided on the array substrate according to requirements. The opposite substrate can be a package substrate, a color filter substrate or the like. In the following descriptions of the present disclosure, an OLED display backplane for an OLED display device is taken as an example to illustrate, but the descriptions are not limitative of the embodiments of the present disclosure.

As illustrated in FIG. 1A, the display backplane in the embodiment of the present disclosure is a flexible display backplane. The flexible display backplane comprises a display area 10 and a peripheral area 20. The peripheral area 20 can further comprise a bending area 30 and a bonding area 40. The display area 10 and the bonding area 40 are on different sides of the bending area 30. The display area 10 comprises a pixel array (not specifically illustrated) for display operation, or the display area can further comprise a touch array for touch operation. A sub-pixel unit of the pixel array comprises an OLED light emitting device. The bond area 40 can be electrically connected to, for example, a tape carrier package (TCP), a chip-on-film (COF) package or the like for electrical connection with a driver chip (for example, a timing driver T-Con, a data driver circuit, a gate driver circuit or the like). Where the flexible display backplane is bent around a central axis in a width direction (a direction W in the figure) of the bending area 30, the bonding area 40 is bent to the back side of the display area 10 of the display backplane, and therefore at least part of the bonding area 40 overlaps the display area 10 in a direction perpendicular to the plane surface of the display backplane; in this way, devices connected or amounted in the bonding area 40 are also correspondingly on the back side of the display backplane, which helps to achieve a display of a narrow frame.

In at least one embodiment, a wire connecting the bond area and the display area can be formed in the bend area 30 according to requirements. The wire can be made of, for example, a metal material.

The flexible display backplane comprises a flexible substrate, and a material of the flexible substrate can be, for example, polyimide, polyester (PET), polymethyl methacrylate (PMMA) or the like, which is not limited in the embodiments of the present disclosure.

Figure 1B:
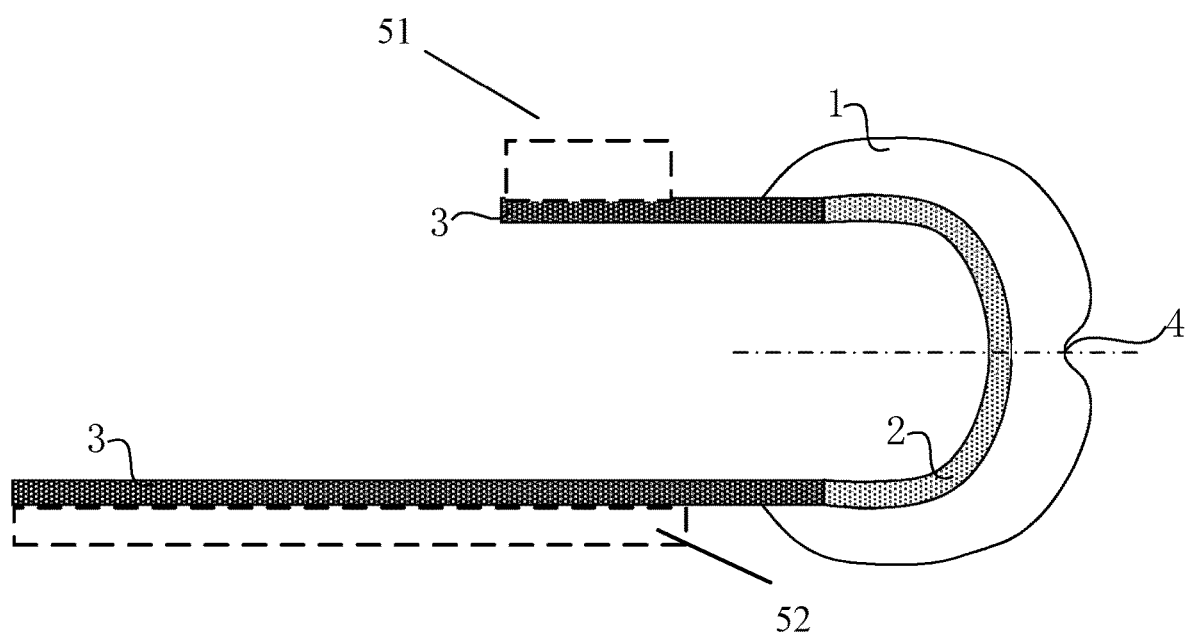
FIGS. 1B and 1C are cross-sectional structure schematic diagrams of a display backplane provided by an embodiment of the present disclosure.

As illustrated in FIGS. 1B, 1C, 2A, 2B, 3 and 4, the embodiment of the present disclosure provides an OLED display backplane. For the purpose of clarity, only a flexible substrate and a buffer structure on the flexible substrate are illustrated in the figures, and other structures (for example, a pixel circuit, a light emitting element and so on) or electronic devices (for example, a flexible circuit board, a driver chip and so on) mounted on the substrate are not illustrated. The display backplane comprises a bending area 2 and a non-bending area 3, the bending area 2 corresponds to the bending area 30 as illustrated in FIG. 1A, and the non-bending area 3 corresponds to the display area 20 and the bonding area 40 as illustrated in FIG. 1A. Specifically, as illustrated in FIG. 1B, the non-bending area 3 in an upper side of the figure corresponds to the bonding area where an electronic device 51 (for example, a flexible circuit board, a driving chip or the like) is mounted or connected, and the non-bending area 3 in a lower side of the figure corresponds to the display area 20 in which a functional structure 52 (for example, a display array, a touch array or the like) is formed. A surface of the bending area 2 that is stretched during a bending process of the bending area 2 (an outer surface in FIG. 1B, that is, a working surface) is coated with an adhesive layer 1, and the adhesive layer 1 is adhered to the surface of the bending area 2 to form the buffer structure for buffering bending stress of the bending area 2. The buffer structure is at the position of a central axis of the bending area 2. For example, the central axis of the buffering structure coincides or substantially coincides with the central axis of the bending area 2.

The adhesive layer 1 has an adhesion property to some degree, and a material of the adhesive layer 1 is, for example, an optical transparent adhesive, a photo-curing adhesive (for example, an ultraviolet (UV) adhesive), a heat-curing adhesive or the like, and for example can comprises an acrylic resin, an organic silicon, and so on.

In the above OLED display backplane, because the adhesive layer 1 is formed with the buffer structure for buffering the bending stress of the bending area 2, when the bending process is performed on the bending area 2 of the OLED display backplane, the stress generated during the bending can be transmitted to the buffer structure and can be buffered or alleviated by the buffer structure to avoid stress concentration in the metal wire of the bending area 2, reducing the breakage possibility of the metal wire where the bending area 2 is bent and improving the bending success ratio of the OLED display backplane. In addition, furthermore, because the central axis of the buffer structure coincides with or substantially coincides with the central axis of the bending area 2, when the bending process is performed on the bending area 2 of the OLED display backplane, symmetrical bending of the bending area 2 can be easily achieved, and the bending process can be more conveniently performed, and the bending success ratio of OLED display backplane is improved accordingly.

Therefore, the above OLED display backplane can reduce the stress concentration in the bending area 2 and can form symmetrical bending more easily, and therefore the bending success ratio of the OLED display backplane is improved and production yield of mass production is improved.

On the basis that the above OLED display backplane can improve the bending success ratio, an embodiment is illustrated in FIGS. 1B, 1C, 2A, 2B, 3 and 4, and the buffer structure is a groove 4 or a protrusion 5 of the adhesive layer 1 formed at the position of the central axis of the bending area 2.

In the above OLED display backplane, the buffer structure can be the groove 4 or the protrusion 5 of the adhesive layer 1 formed at the position of the central axis of the bending area 2, and can also be other structure capable of buffering the bending stress of the bending area 2. A specific structure of the buffer structure can be selected according to an actual configuration of the OLED display backplane.

In a situation where the buffer structure is the groove 4 of the adhesive layer 1 formed at the position of the central axis of the bending area 2, a bending process is performed on the bending area 2 of the OLED display backplane around the central axis of the bending area 2, and the stress generated during the bending area 2 being bent is transmitted to the groove 4, and the stress is alleviated by the buffering effect of the groove 4. Specifically, the groove 4 is outwardly protruded after being forced, and the bending stress concentration of the metal wire in the bending area 2 is reduced, which can reduce the breakage possibility of the internal metal line during the bending area 2 being bent, and improve the bending success ratio of the OLED display backplane. Moreover, because the buffer structure is the groove 4 of the adhesive layer 1 formed at the position of the central axis of the bending area 2, the bending area 2 can achieve symmetrical bending easily when being bent, and the bending process can be performed more conveniently.

In a situation where the buffer structure is the protrusion 5 of the adhesive layer 1 formed at the position of the central axis of the bending area 2, a bending process is performed on the bending area 2 of the OLED display backplane around the central axis of the bending area 2, and the stress generated during the bending area 2 being bent is transmitted to the protrusion 5, and the stress is alleviated by the buffering effect of the protrusion 5. Specifically, the protrusion 5 moves outwardly, and the bending stress concentration of the metal wire in the bending area 2 is reduced, which can reduce the breakage possibility of the internal metal line during the bending area 2 being bent, and improve the bending success ratio of the OLED display backplane. Moreover, because the buffer structure is the protrusion 5 of the adhesive layer 1 formed at the position of the central axis of the bending area 2, the bending area 2 can achieve symmetrical bending easily when being bent, and the bending process can be performed more conveniently.

Based on the above OLED display backplane, in other examples of the embodiment, in order to improve the bending success ratio, the buffer structure can extend to two edges of the bending area 2 (that is, as illustrated in FIG. 1B, etc., the portion of the bending area in a horizontal state after the bending area is bent and at the position where the bending area and the non-bending area are connected).

Figure 1C:
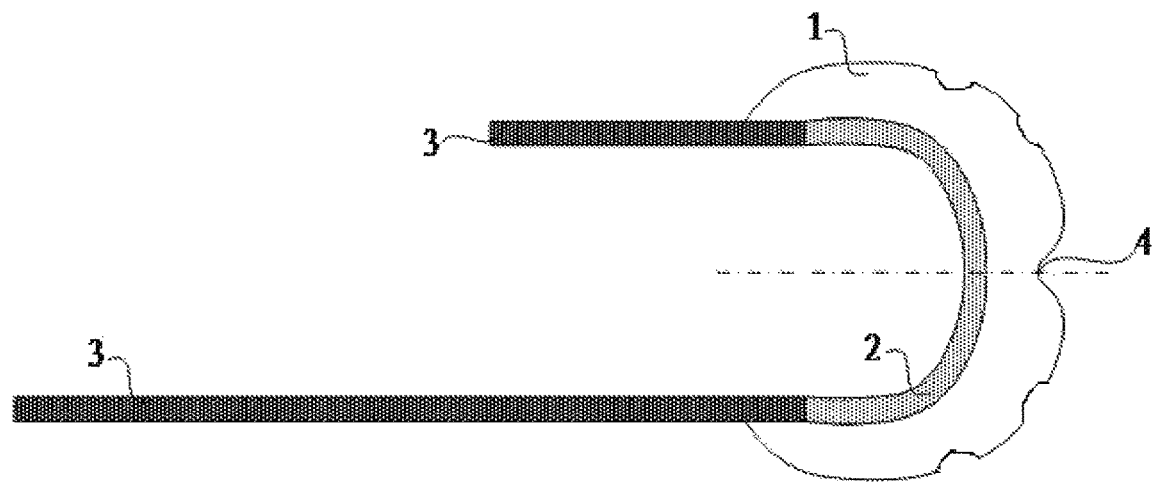

In the above OLED display backplane, the buffer structure can be arranged in the following exemplary arrangement ways:

First way. A plurality of grooves 4 are distributed in an array from the central axis of the bending area 2 to the two edges of the bending area 2, as illustrated in FIG. 1C, the stress generated during the bending area 2 being bent is transmitted to the plurality of grooves 4 and the bending stress concentration in the metal wire of the bending area 2 is reduced by the buffering effect of the plurality of grooves 4.

Figure 2A:
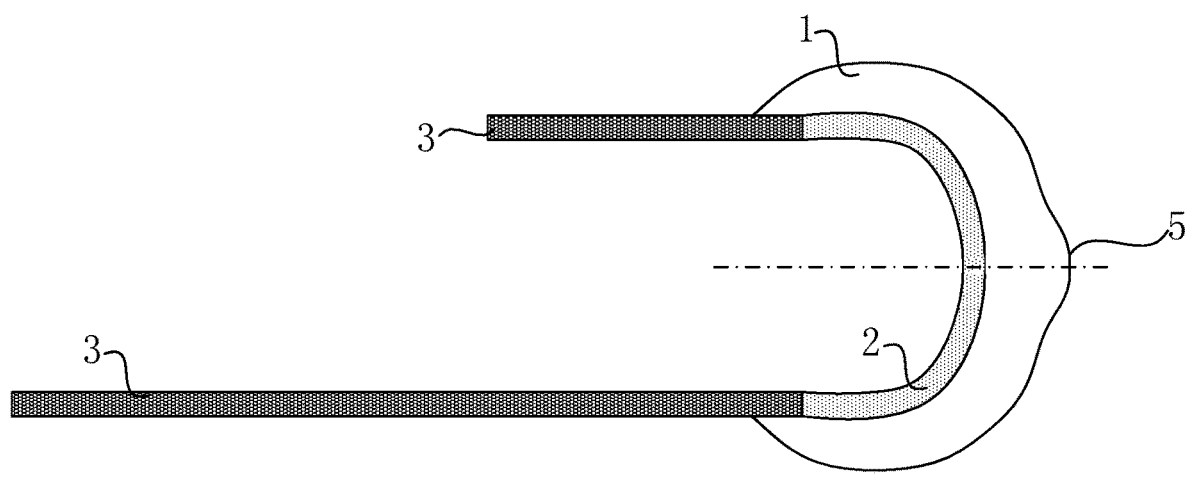
FIGS. 2A and 2B are another cross-sectional structure schematic diagrams of a display backplane provided by an embodiment of the present disclosure.
Figure 2B:
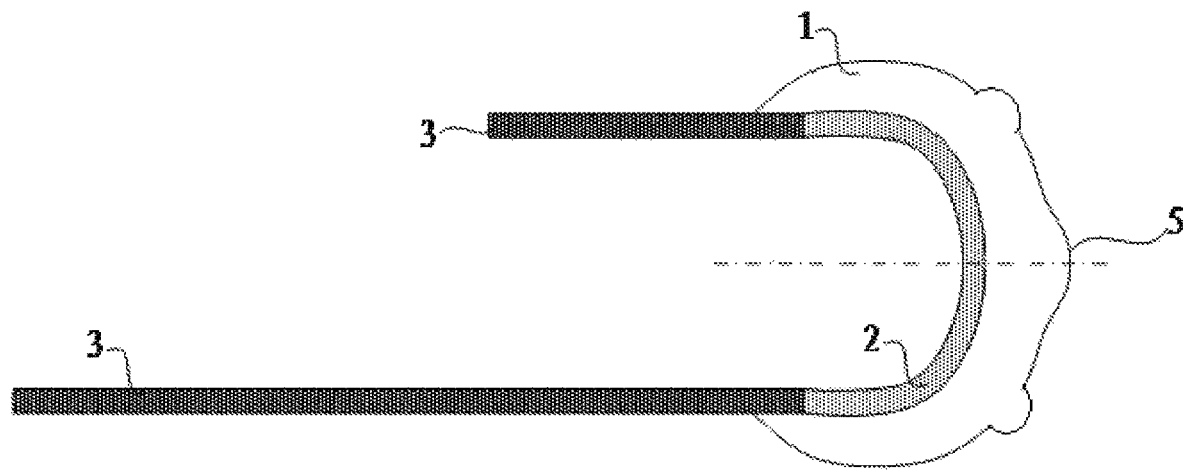

Second way. A plurality of protrusions 5 are distributed in an array from the central axis of the bending area 2 to the two edges of the bending area 2, as illustrated in FIG. 2B, the stress generated during the bending area 2 being bent is transmitted to the plurality of protrusions 5 and the bending stress concentration in the metal wire of the bending area 2 is reduced by the buffering effect of the plurality of protrusions 5.

Third way. One groove 4 is distributed from the central axis of the bending area 2 to the two edges of the bending area 2, the stress generated during the bending area 2 being bent is transmitted to the groove 4 and the bending stress concentration in the metal wire of the bending area 2 is reduced by the buffering effect of the groove 4.

Fourth way. One protrusion 5 is distributed from the central axis of the bending area 2 to the two edges of the bending area 2, the large stress generated during the bending area 2 being bent is transmitted to the protrusion 5 and the bending stress concentration in the metal wire of the bending area 2 is reduced by the buffering effect of the protrusion 5.

For example, a cross-sectional shape of the groove or the protrusion used as the buffer structure in a plane that is perpendicular to the direction of the central axis of the bending area is a V-shape, a circular arc shape or a U-shape.

In the OLED display backplane of the embodiments of the present disclosure, the cross-sectional shape of the buffer structure can be a V-shape, a circular arc shape or a U-shape, and can also be other symmetrical shapes with respect to the central axis of the bending area 2, and the specific cross-sectional shape of the buffer structure can be selected according to an actual situation of the OLED display backplane.

In the OLED display backplane of the embodiments of the present disclosure, the buffer structure can be a groove 4 with a cross-sectional shape of a V-shape, a circular arc shape or a U-shape, and the buffer structure can also be a protrusion 5 with a cross-sectional shape of a V-shape, a circular arc shape or a U-shape, and the buffer structure can also be other structure capable of buffering the bending stress of the bending area 2. A specific structure of the buffer structure can be selected according to an actual situation of the OLED display backplane.

Figure 3:
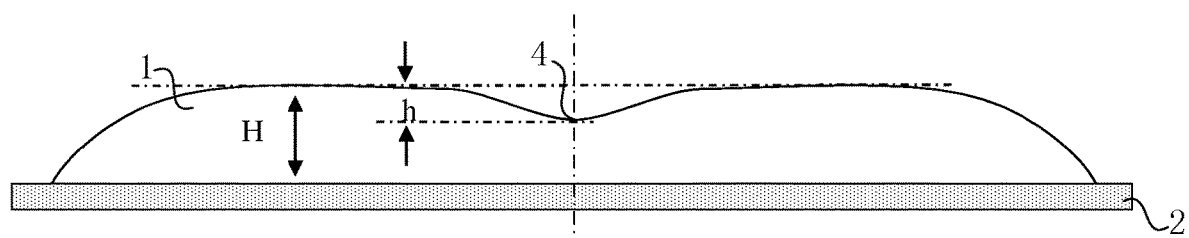
FIG. 3 is a structure schematic diagram of a display backplane provided by an embodiment of the present disclosure before a bending area of the display backplane is bent.
Figure 4:
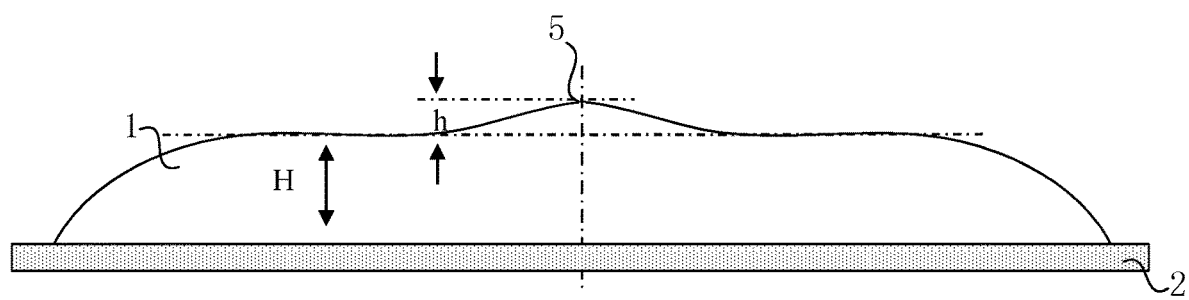
FIG. 4 is another structure schematic diagram of a display backplane provided by an embodiment of the present disclosure before a bending area of the display backplane is bent.

For example, where the buffer structure is the groove 4, in a state before the display backplane is bent, as illustrated in FIG. 3, a depth h of the groove 4 is ⅓ to ⅔ (e.g., ½) of a thickness H of the coated adhesive layer 1; alternatively, as illustrated in FIG. 4, where the buffer structure is the protrusion 5, a height h of the protrusion 5 is ⅓ to ⅔ (e.g., ½) of the thickness H of the adhesive layer 1.

For example, where the buffer structure is the groove 4, in the state before the display backplane is bent, the depth of the groove 4 can be ⅓, 5/12, ½, 7/12 or ⅔ of the thickness of the coated adhesive layer 1, and the specific depth of the groove 4 can be selected according to an actual situation of the OLED display backplane. Where the buffer structure is the protrusion 5, the height of the protrusion 5 is ⅓, 5/12, ½, 7/12 or ⅔ of the thickness of the adhesive layer 1, and the specific height of the protrusion 5 can be selected according to an actual situation of the OLED display backplane.

At least one embodiment of the present disclosure provides a display device, display device comprises any one of the above-described display backplanes, the display backplane comprises a bending area and a non-bending area, and because the bending area of the display backplane is bent around the central axis of the bending area, a narrow frame design can be achieved. The non-bending area comprises a display area and a bonding area, and the display area and the bonding area are respectively on two different sides of the bending area. The display area comprises a pixel array for display operation, or the display area can further comprise a touch array for touch operation. The bonding area can be electrically connected to, for example, a tape carrier package (TCP), a chip-on-film (COF) package or the like for electrical connection with a driver chip (for example, a timing driver T-Con, a data driver circuit, a gate driver circuit or the like).

The display device is, for example, a liquid crystal display device, an OLED display device, an electronic paper display device or the like. The display device can be any product or component having a display function such as a mobile phone, a tablet computer, a television, a display, a notebook computer, a digital photo frame, a navigator or the like.

Figure 5A:
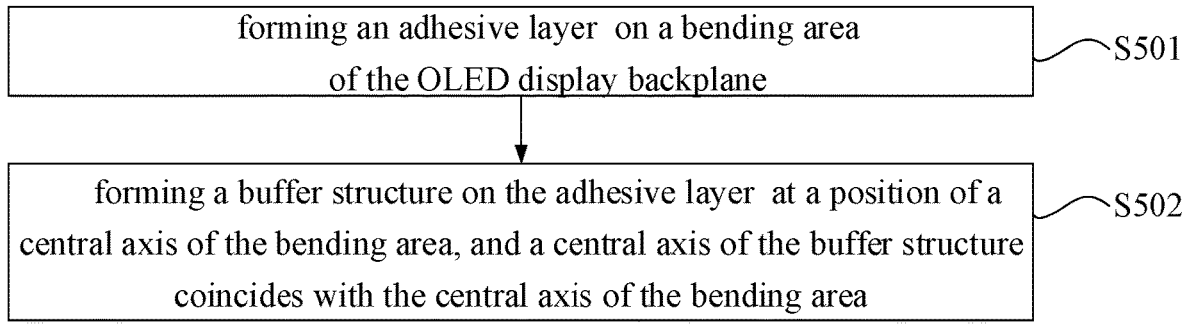
FIG. 5A is a flow diagram of a manufacture method of a display backplane provided by an embodiment of the present disclosure.

In addition, at least one embodiment of the present disclosure further provides a manufacture method of a display backplane according to any one of the above technical solutions. The display backplane can be a liquid crystal display backplane, an OLED display backplane or the like. A manufacture method of an OLED display backplane is taken as an example for illustration. As illustrated in FIG. 5A, the manufacture method of an OLED display backplane comprises the following steps:

Step S501: forming an adhesive layer 1 on a bending area 2 of the OLED display backplane; and Step S502: forming a buffer structure on the adhesive layer 1 at a position of a central axis of the bending area 2, wherein a central axis of the buffer structure coincides with the central axis of the bending area 2.

In the above manufacture method of an OLED display backplane, a buffer structure is formed with the adhesive layer 1 at the position of the central axis of the bending area 2, and then the bending process is performed, and therefore the bending success ratio of the OLED display backplane can be improved.

Before step S501, an OLED display backplane is provided. The display backplane comprises a display area, a bending area and a bonding area, and the display area and the bonding area are on different sides of the bending area. The display area comprises a pixel array for display operation, or the display area can further comprise a touch array for touch operation. A sub-pixel unit of the pixel array comprises an OLED light emitting device. The bonding area can be electrically connected to, for example, a tape carrier package (TCP), a chip-on-film (COF) package or the like for electrical connection with a driver chip (for example, a timing driver T-Con, a data driver circuit, a gate driver circuit or the like).

An adhesive material used for forming the adhesive layer 1 is, for example, an optical transparent adhesive, a photo-cured adhesive (for example, an ultraviolet (UV) adhesive), a heat-cured adhesive or the like, and for example comprising an acrylic resin, an organic silicon and so on.

Correspondingly, after the above buffer structure is formed at the position of the central axis of the bending area 2, the manufacture method of the OLED display backplane further comprises bending the bending area around its central axis, therefore part of the display backplane (the bonding area) is allowed to be bent to the back side so as to at least partially overlap with another part (for example, the display area) of the display backplane in a direction perpendicular to the plane surface of the display backplane.

Then, in a manufacture method of a display device according to at least one embodiment of the present disclosure, a structure such as a thin film package, a package cover plate or the like can be subsequently provided on the display backplane.

Figure 5B:
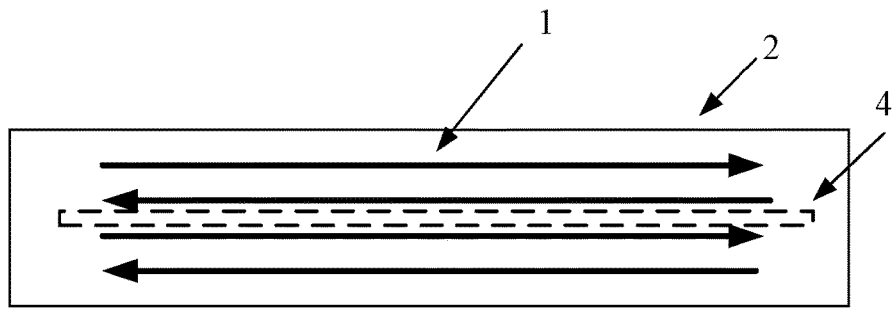
FIG. 5B is a schematic diagram of a manufacture method of a display backplane provided by an embodiment of the present disclosure.

In an example, the adhesive layer 1 is formed in the bending area 2 of the OLED display backplane through step S501, as illustrated in FIG. 5B, the adhesive layer 1 is coated by a way of back-and-forth scanning line by line (refer to an arrow in the figure) through an adhesive coating device (not illustrated) to allow the adhesive layer 1 to have a substantially uniform thickness first. Then, the adhesive layer 1 formed in step S501 is processed to form the buffer structure 4 in step S502, and the buffer structure 4 is at the position of the central axis of the bending area 2. For example, the central axis of the buffer structure coincides with or substantially coincides with the central axis of the bending area 2, and the processes in above manufacture method of an OLED display backplane are simple and can be performed easily.

The adhesive coating device comprises a nozzle, an adhesive storage container and a conduit connecting the nozzle and the adhesive storage container, for example. The nozzle is, for example, a nozzle driven by air pressure, hydraulic pressure or the like. The adhesive material of the adhesive layer 1 has fluidity to some extent, is stored in the adhesive storage container, and is coated on the flexible substrate of the display backplane by the nozzle.

Figure 6:
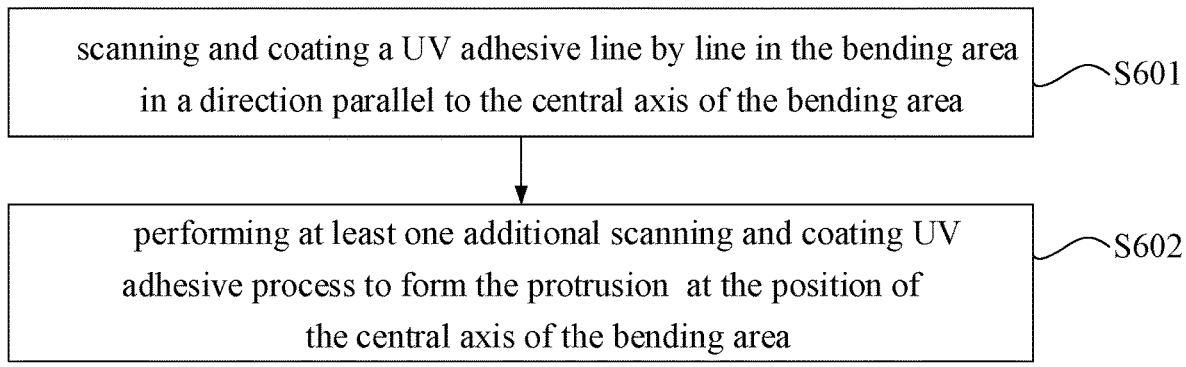
FIG. 6 is a flow diagram of a manufacture method of a buffer structure of a display backplane provided by an embodiment of the present disclosure.
Figure 7:
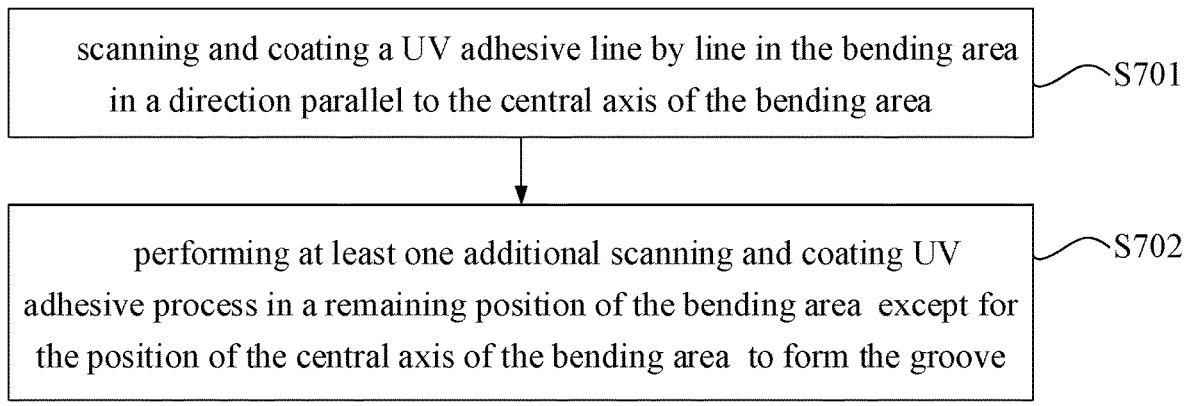
FIG. 7 is another flow diagram of a manufacture method of a buffer structure of a display backplane provided by an embodiment of the present disclosure.

Based on the above manufacture method of an OLED display backplane, an embodiment is illustrated in FIG. 6, the buffer structure is formed on the adhesive layer 1 at the position of the central axis of the bending area 2, and the embodiment comprises the following steps:

Step S601: scanning and coating a UV adhesive line by line in the bending area 2 in a direction parallel to the central axis of the bending area 2; and Step S602: performing at least one additional scanning and coating UV adhesive process to form the protrusion 5 at the position of the central axis of the bending area 2.

In another embodiment, as illustrated in FIG. 6, the buffer structure is formed on the adhesive layer 1 at the position of the central axis of the bending area 2, and the embodiment comprises the following steps:

Step S701: scanning and coating a UV adhesive line by line in the bending area 2 in a direction parallel to the central axis of the bending area 2; and Step S702: performing at least one additional scanning and coating UV adhesive process in a remaining position of the bending area 2 except for the position of the central axis of the bending area 2 to form the groove 4.

In the above manufacture method of an OLED display backplane, the adhesive layer 1 of the bend area 2 can be conveniently formed by scanning and coating UV adhesive line by line, and a coating adhesive effect of concave or convex of the adhesive layer 1 at the position of the central axis is achieved by reducing or adding one adhesive coating process at the position of the central axis, which allows the bending success ratio of the OLED display backplane to be better improved and the symmetrical bending to be formed more easily.

In addition, the method for forming the buffer structure on the adhesive layer 1 at the position of the central axis of the bending area 2 is not limited to the above two method, and the method can also be any other method capable of forming the buffer structure on the adhesive layer 1 at the position of the central axis of the bending area 2.

In order to obtain a protrusion in a cross-sectional shape that is symmetrical with respect to the central axis of the bending area 2, for example, the performing of at least one additional scanning and coating process to form the protrusion 5 at the position of the central axis of the bending area 2 comprises the following operations: performing a plurality of scanning and coating processes at the position of the central axis of the bending area 2; wherein the number of scanning and coating processes gradually decreases in a direction from the central axis of the bending area 2 to an edge of the bending area.

In the above manufacture method of an OLED display backplane, the protrusion 5 can be formed by performing a plurality of scanning and coating UV adhesive process at the position of the central axis of the bending area 2, and the cross-sectional shape of the protrusion 5 being symmetrical with respect to the central axis of the bending area 2 can be ensured by allowing the number of scanning and coating UV adhesive processes to gradually decrease in a direction from the central axis of the bending area 2 to the edge of the bending area 2.

In order to obtain the groove 4 in cross-sectional shape that is symmetrical with respect to the central axis of the bending area 2, for example, the performing of at least one additional scanning and coating process in the remaining position of the bending area except for the position of the central axis of the bending area to form the groove comprises the operations: performing a plurality of scanning and coating processes in the remaining position of the bending area except for the position of the central axis of the bending area; wherein the number of scanning and coating processes gradually increases in a direction from the central axis of the bending area to an edge of the bending area.

In the above manufacture method of an OLED display backplane, the groove 4 can be formed by performing a plurality of scanning and coating UV adhesive process at the remaining position of the bending area 2 except for the position of the central axis of the bending area 2, and the cross-sectional shape of the groove 4 being symmetrical with respect to the central axis of the bending area 2 can be ensured by allowing the number of scanning and coating UV adhesive processes to gradually increase in a direction from the central axis of the bending area 2 to the edge of the bending area 2.

After the above adhesive layer 1 comprising the buffer structure is formed, a curing process such as a photo curing process, a thermal curing process or the like can be performed on at least part of the adhesive layer 1 according to the material used and requirements of subsequent processes.

What are described above is related to the illustrative embodiments of the disclosure only and not limitative to the scope of the disclosure; the scopes of the disclosure are defined by the accompanying claims.

What is claimed is:

1. A display backplane, comprising a bending area and a non-bending area, wherein the bending area comprises an adhesive layer on a surface of the bending area that is stretched during the bending area being bent around a central axis of the bending area, and the adhesive layer comprises a buffer structure for buffering bending stress of the bending area, and the buffer structure is at a position of the central axis of the bending area, the buffer structure is a protrusion formed at the position of the central axis of the bending area on the adhesive layer, and a height of the protrusion is ⅓ to ⅔ of a thickness of the adhesive layer, the thickness of the adhesive layer is a distance from an end of the adhesive layer that is connected with the protrusion to an end of the adhesive layer that is away from the protrusion.

2. The display backplane according to claim 1, wherein a central axis of the buffer structure coincides with the central axis of the bending area.

3. The display backplane according to claim 2, wherein the buffer structure extends to two edges of the bending area.

4. The display backplane according to claim 2, wherein a cross-sectional shape of the buffer structure in a plane perpendicular to a direction of the central axis of the bending area is a V-shape, a circular arc shape or a U-shape.

5. The display backplane according to claim 2, wherein the buffer structure comprises a plurality of protrusions symmetrically arranged in the adhesive layer with respect to the central axis of the bending area.

6. A display device, comprising the display backplane according to claim 1, wherein the bending area of the display backplane is bent around the central axis of the bending area.

7. The display device according to claim 6, wherein the non-bending area comprises a display area and a bonding area, and the display area and the bonding area are respectively on two sides of the bending area.

8. The display device according to claim 1, wherein the display device is an OLED display device.

9. The display backplane according to claim 1, wherein the adhesive layer comprises an optical transparent adhesive, a photo-curing adhesive, or a heat-curing adhesive.

10. A manufacture method of a display backplane according to claim 1, comprising:
   forming the adhesive layer on the surface of the bending area that is stretched during the bending area being bent around the central axis of the bending area; and
   forming the buffer structure on the adhesive layer at the position of the central axis of the bending area.

11. The manufacture method according to claim 10, wherein a central axis of the buffer structure coincides with the central axis of the bending area.

12. The manufacture method according to claim 10, further comprising:
   bending the bending area around the central axis of the bending area after the buffer structure is formed.

13. A manufacture method of a display backplane, wherein display backplane comprises a bending area and a non-bending area, wherein the bending area comprises an adhesive layer on a surface of the bending area that is stretched during the bending area being bent around a central axis of the bending area, and the adhesive layer comprises a buffer structure for buffering bending stress of the bending area, and the buffer structure is at a position of the central axis of the bending area, the method comprises:
   forming the adhesive layer on the surface of the bending area that is stretched during the bending area being bent around the central axis of the bending area; and
   forming the buffer structure on the adhesive layer at the position of the central axis of the bending area, wherein a central axis of the buffer structure coincides with the central axis of the bending area, and the buffer structure is a groove or a protrusion formed at the position of the central axis of the bending area on the adhesive layer,
   wherein the forming of the buffer structure on the adhesive layer at the position of the central axis of the bending area comprises:
   scanning and coating an adhesive line by line in the bending area in a direction parallel to the central axis of the bending area; and
   performing at least one additional scanning and coating process to form the protrusion at the position of the central axis of the bending area; alternatively, performing at least one additional scanning and coating process in a remaining position of the bending area except for the position of the central axis of the bending area to form the groove.

14. The manufacture method according to claim 13, wherein the performing of at least one additional scanning and coating process to form the protrusion at the position of the central axis of the bending area comprises:
   performing a plurality of scanning and coating processes at the position of the central axis of the bending area, wherein a number of scanning and coating processes gradually decreases in a direction from the central axis of the bending area to an edge of the bending area.

15. The manufacture method according to claim 13, wherein the performing of at least one additional scanning and coating process in the remaining position of the bending area except for the position of the central axis of the bending area to form the groove comprises:
   performing a plurality of scanning and coating processes in the remaining position of the bending area except for the position of the central axis of the bending area, wherein a number of scanning and coating processes gradually increases in a direction from the central axis of the bending area to an edge of the bending area.

* * * * *